(12) United States Patent
Kwack et al.

(10) Patent No.: US 8,796,727 B2
(45) Date of Patent: Aug. 5, 2014

(54) ORGANIC LIGHT EMITTING DIODE DISPLAY

(75) Inventors: Jin-Ho Kwack, Yongin (KR);
Dong-Won Han, Yongin (KR);
Dae-Beom Shin, Yongin (KR);
Seung-Yong Song, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/292,046

(22) Filed: Nov. 8, 2011

(65) Prior Publication Data

US 2012/0235207 A1    Sep. 20, 2012

(30) Foreign Application Priority Data

Mar. 18, 2011 (KR) .................. 10-2011-0024113

(51) Int. Cl.
*H01L 51/52* (2006.01)
(52) U.S. Cl.
USPC .......................................... 257/100

(58) Field of Classification Search
USPC ............................................. 257/100
See application file for complete search history.

(56) References Cited

U.S. PATENT DOCUMENTS

2008/0164808 A1    7/2008 Kim et al.

FOREIGN PATENT DOCUMENTS

KR    10-2009-0112387 A    10/2009
WO    WO 2007113177 A1 *  10/2007

* cited by examiner

*Primary Examiner* — Robert Carpenter
(74) *Attorney, Agent, or Firm* — Christie, Parker & Hale, LLP

(57) ABSTRACT

An organic light emitting diode display includes: a substrate; a display area including an organic light emitting element on the substrate; an organic encapsulation layer covering the organic light emitting element and having a second boundary spaced from a first boundary of the display area by a first distance; and an inorganic encapsulation layer having a peripheral area contacting the substrate and covering the organic encapsulation layer.

4 Claims, 4 Drawing Sheets

… (US 8,796,727 B2)

ORGANIC LIGHT EMITTING DIODE DISPLAY

CROSS-REFERENCE TO RELATED APPLICATION

This application claims priority to and the benefit of Korean Patent Application No. 10-2011-0024113 filed in the Korean Intellectual Property Office on Mar. 18, 2011, the entire content of which is incorporated herein by reference.

BACKGROUND

1. Field

The described technology relates generally to an organic light emitting diode (OLED) display.

2. Description of Related Art

Display devices, such as the organic light emitting diode display, are used to display images.

The organic light emitting diode display has a self luminance characteristic and does not use a separate light source, unlike a liquid crystal display (LCD) device, and thus can have reduced thickness and weight. Further, the organic light emitting diode display has characteristics of low power consumption, high luminance, and high response speed.

In general, the organic light emitting diode display includes a substrate, organic light emitting diodes provided on the substrate, and an encapsulation member facing the substrate with the organic light emitting elements therebetween to encapsulate the organic light emitting elements.

Recently, an organic light emitting diode display using a thin film for the encapsulation member has been developed.

The above information disclosed in this Background section is only for enhancement of understanding of the background of the described technology and therefore it may contain information that does not form the prior art that is already known in this country to a person of ordinary skill in the art.

SUMMARY

Aspects of embodiments according to the present invention are directed toward an organic light emitting diode display with an improved encapsulation life-span for the organic light emitting element.

An exemplary embodiment provides an organic light emitting diode display including: a substrate; a display area including an organic light emitting element on the substrate; an organic encapsulation layer covering the organic light emitting element and having a second boundary spaced from a first boundary of the display area by a first distance; and an inorganic encapsulation layer having a peripheral area contacting the substrate and covering the organic encapsulation layer.

The first boundary of the display area may have a quadrangular shape with four edges and four vertices, and the second boundary of the organic encapsulation layer may have a closed loop shape.

The inorganic encapsulation layer may have a quadrangular third boundary with four edges and four vertices, and an edge of the third boundary may be spaced from the second boundary by a second distance.

A vertex of the four vertices of the third boundary may be spaced from the second boundary by a third distance, and the third distance satisfies the equation:

$$Y = b\sqrt{2} + (a\sqrt{2} - a) \quad \text{Equation}$$

where Y is the third distance, a is the first distance, and b is the second distance.

The substrate may be flexible.

According to an embodiment, an organic light emitting diode display includes a substrate having a display area, a first encapsulation layer covering the display area on the substrate, and a second encapsulation layer covering the first encapsulation layer. The first encapsulation layer has a first boundary extending beyond a boundary of the display area by a first distance, and the second encapsulation layer has a peripheral area in contact with the substrate.

According to the embodiments, an organic light emitting diode display with improved encapsulation life-span for the organic light emitting element is provided.

DETAILED DESCRIPTION OF THE EMBODIMENTS

Figure 1:
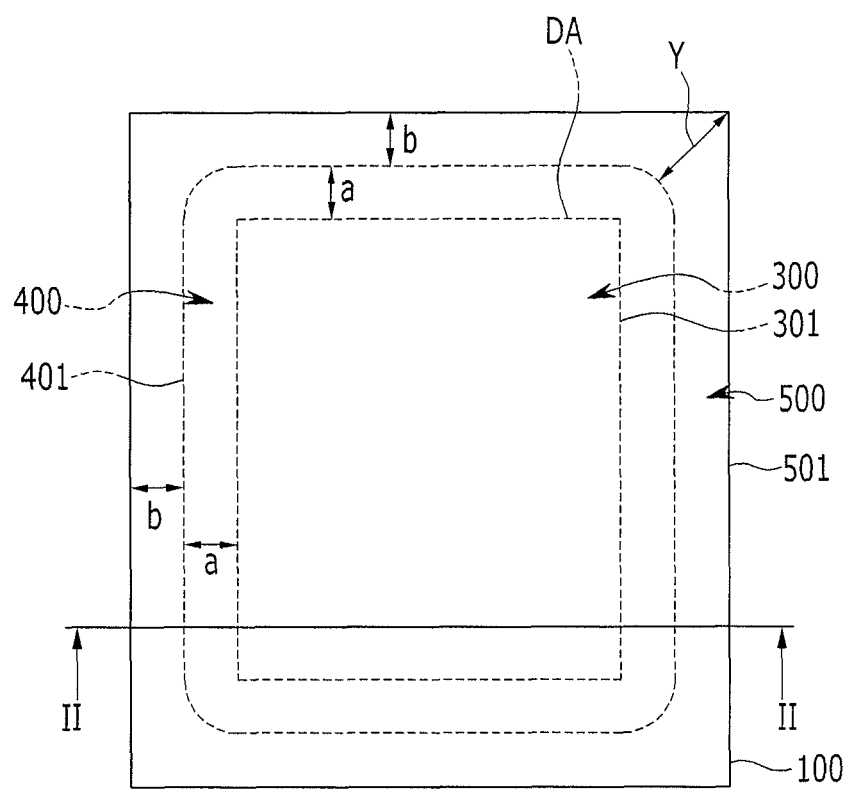
FIG. 1 shows a top plan view of an organic light emitting diode display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Descriptions of parts not related to the present invention may be omitted, and like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses.

In the drawings, the thicknesses of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element, or one or more intervening elements may also be present.

In addition, unless explicitly described to the contrary, the word "comprise" and variations such as "comprises" or "comprising" will be understood to imply the inclusion of stated elements, but not the exclusion of any other elements. In addition, "on" is either positioned on or below a portion of a target or positioned on the upper side based on a gravity direction, throughout the specification.

An organic light emitting diode (OLED) display according to an exemplary embodiment will now be described with reference to FIGS. 1 to 4.

Figure 2:
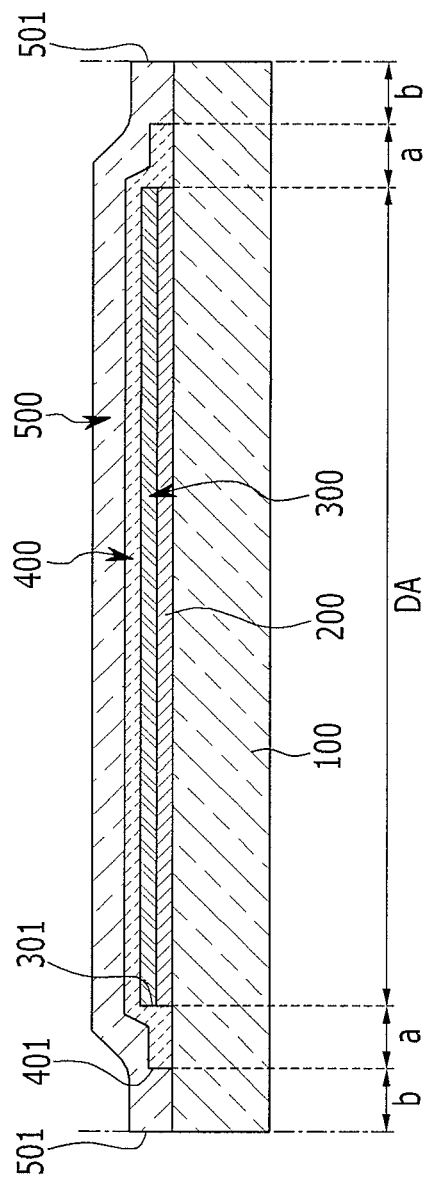
FIG. 2 shows a schematic cross-sectional view taken along the line II-II of FIG. 1.

FIG. 1 shows a top plan view of an organic light emitting diode display according to an exemplary embodiment. FIG. 2 shows a schematic cross-sectional view taken along the line II-II of FIG. 1. While the cross section of the OLED display is shown schematically in FIG. 2, encapsulation layers 400 and 500 may encapsulate a plurality of organic light emitting elements 300, up to and include the entire display area of a substrate 100.

As shown in FIG. 1 and FIG. 2, the organic light emitting diode (OLED) display includes the substrate 100, a wire 200, an organic light emitting element 300, the organic encapsulation layer 400, and the inorganic encapsulation layer 500. The organic light emitting element 300 may include a plurality of organic light emitting diodes.

The substrate 100 includes at least one of a glass, a polymer, or a metal, and is made of a transparent, light reflective, or light absorptive material. The substrate 100 may be flexible. The wire 200 and the organic light emitting element 300 are provided on the substrate 100, and the substrate 100 faces the organic encapsulation layer 400 and the inorganic encapsulation layer 500 with both the wire 200 and the organic light emitting element 300 therebetween. The substrate 100, the organic encapsulation layer 400, and the inorganic encapsulation layer 500 are sealed to each other with the organic light emitting element 300 therebetween. The substrate 100, the organic encapsulation layer 400, and the inorganic encapsulation layer 500 protect the wire 200 and the organic light emitting element 300 from external interference or elements. As shown in FIG. 1, the substrate 100 has a quadrangular shape with four edges and four vertices. The substrate may have a triangular, polygonal, or circular shape in another exemplary embodiment.

Figure 3:
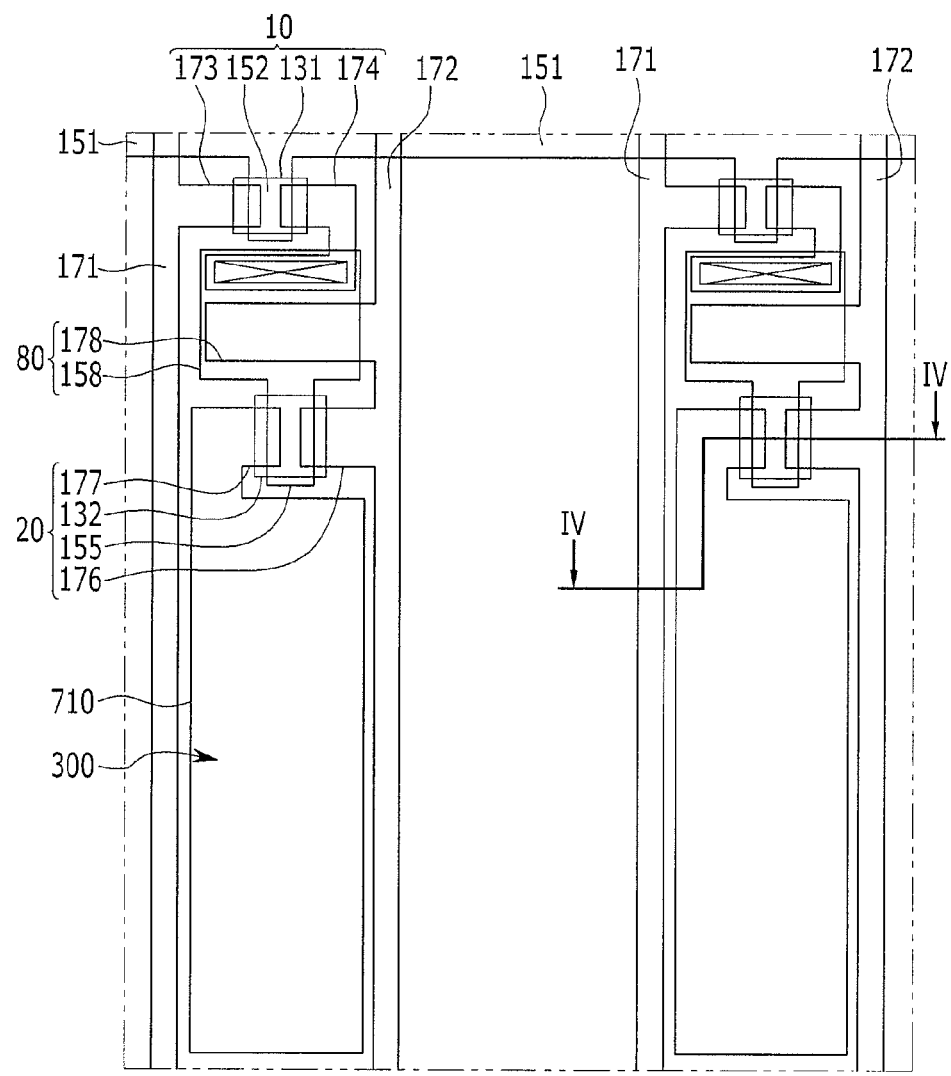
FIG. 3 shows a layout view of a configuration of a pixel of an organic light emitting diode display according to an exemplary embodiment.

The wire 200 includes (or is coupled to) at least one of first and second thin film transistors 10 and 20 shown in FIG. 3, and transmits a signal to the organic light emitting element 300 to drive the organic light emitting element 300. The organic light emitting element 300 emits light according to the signal provided by the wire 200.

The organic light emitting element 300 is provided on the wire 200.

The organic light emitting element 300 is provided on the substrate 100 and receives the signal from the wire 200 in order to display an image.

An organic light emitting diode (OLED) display according to an exemplary embodiment will now be described with reference to FIG. 3 and FIG. 4.

FIG. 3 shows a layout view of a configuration of a pixel of an organic light emitting diode display according to an exemplary embodiment. FIG. 4 shows a cross-sectional view taken along the line IV-IV of FIG. 3.

Figure 4:
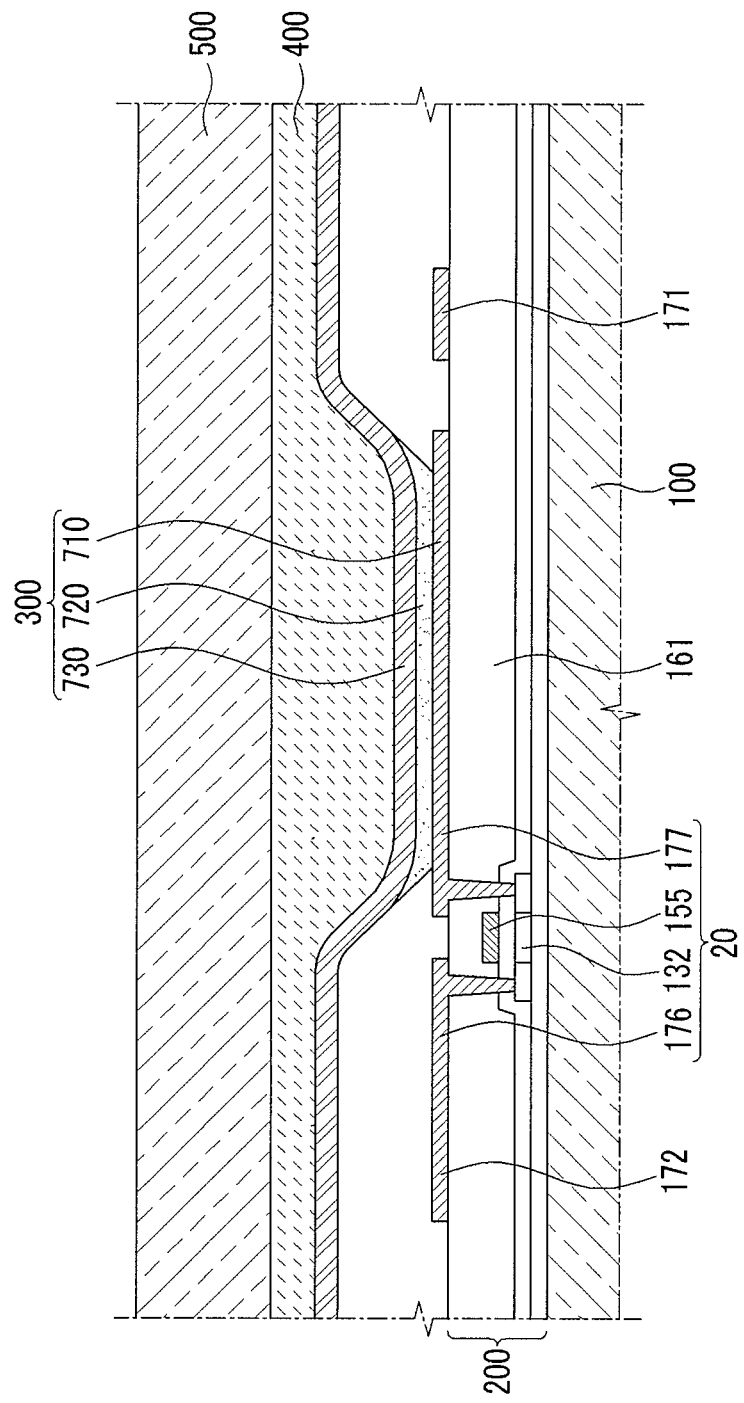
FIG. 4 shows a cross-sectional view taken along the line IV-IV of FIG. 3.

A detailed configuration of the wire 200 and the organic light emitting element 300 is shown in FIG. 3 and FIG. 4, and the exemplary embodiment is not restricted to the configuration shown in FIG. 3 and FIG. 4. The wire 200 and the organic light emitting element 300 can be formed in various ways known to a skilled person in the art. For example, a 2Tr-1Cap structured active matrix (AM) type organic light emitting diode display including two thin film transistors and a capacitor for each pixel is shown for the organic light emitting diode (OLED) display in the accompanying drawings. However, the present invention is not limited thereto. Therefore, the organic light emitting diode display of the present invention is not restricted to the number of the thin film transistors, capacitors, and wires. The pixel represents a minimum unit for displaying an image, and the organic light emitting diode display displays an image by using a plurality of pixels.

As shown in FIG. 3 and FIG. 4, the organic light emitting diode (OLED) display includes a switching thin film transistor 10, a drive thin film transistor 20, a capacitor 80, and an organic light emitting element 300 for each pixel. Here, the switching thin film transistor 10, the drive thin film transistor 20, and the capacitor 80 configure the wire 200. The wire 200 further includes a gate line 151 extending in one direction of the substrate 100, a data line 171 crossing the gate line 151 in an insulated manner, and a common power supply line 172. In this instance, a single pixel can be defined by the boundaries of the gate line 151, the data line 171, and the common power supply line 172, but is not limited thereto.

The organic light emitting element 300 includes a first electrode 710, an organic emission layer 720 formed on the first electrode 710, and a second electrode 730 formed on the organic emission layer 720. The first electrode 710, the organic emission layer 720, and the second electrode 730 configure the organic light emitting element 300. Here, the first electrode 710 may be an anode, which is a hole injection electrode, and the second electrode 730 may be a cathode, which is an electron injection electrode. However, the exemplary embodiment is not limited thereto, and the first electrode 710 may be a cathode, and the second electrode 730 may be an anode depending on the method for driving the organic light emitting diode (OLED) display. The holes and the electrons are injected into the organic emission layer 720 from the first electrode 710 and the second electrode 730, respectively, and when excitons generated by combination of the holes and the electrons enter a ground state from an excited state, the organic emission layer 720 emits light. Also, at least one of the first electrode 710 and the second electrode 730 is formed to have a transparent structure so the organic light emitting element 300 emits light in a direction of the electrode that has a transparent structure. That is, the organic light emitting diode (OLED) display can be formed to be a front light emitting type (e.g., top emission type), a rear light emitting type (e.g., bottom emission type), or a front/rear light emitting type.

The capacitor 80 includes a pair of capacitor plates 158 and 178 with an interlayer insulating layer 161 disposed therebetween. Here, the interlayer insulating layer 161 functions as a dielectric material, and charges stored in the capacitor 80 are determined by the capacitance of the capacitor 80 and a voltage between the capacitor plates 158 and 178.

The switching thin film transistor 10 includes a switching semiconductor layer 131, a switching gate electrode 152, a switching source electrode 173, and a switching drain electrode 174. The drive thin film transistor 20 includes a drive semiconductor layer 132, a drive gate electrode 155, a drive source electrode 176, and a drive drain electrode 177.

The switching thin film transistor 10 is used as a switch for selecting a pixel to emit light. The switching gate electrode 152 is connected to the gate line 151. The switching source electrode 173 is connected to the data line 171. The switching drain electrode 174 is separately disposed from the switching source electrode 173 and is connected to the capacitor plate 158.

The drive thin film transistor 20 applies drive power for emitting the organic emission layer 720 of the organic light emitting element 300 within the selected pixel through the first electrode 710 to the second electrode 730. The drive gate electrode 155 is connected to the capacitor plate 158 that is connected to the switching drain electrode 174. The drive source electrode 176 and the capacitor plate 178 are connected to the common power supply line 172. The drive drain electrode 177 is provided at the same layer as the first electrode 710 and is connected to the first electrode 710.

In the organic light emitting diode (OLED) display according to the exemplary embodiment, the drive drain electrode 177 is provided at the same layer as the first electrode 710. However, the drive drain electrode of the organic light emitting diode (OLED) display according to another exemplary embodiment may be provided at a different layer from the first electrode to be connected to the first electrode through an opening formed in the insulation layer.

According to the above-described configuration, the switching thin film transistor 10 is operable by the gate voltage applied to the gate line 151 to transmit the data voltage applied to the data line 171 to the drive thin film transistor 20. A voltage corresponding to the difference between the voltage applied to the drive thin film transistor 20 from the common power supply line 172 and the data voltage provided by the switching thin film transistor 10 is stored in the capacitor 80, and a current corresponding to the voltage stored in the capacitor 80 flows to the organic light emitting element 300 through the drive thin film transistor 20 to have the organic light emitting element 300 emit light. The organic light emitting diode (OLED) display displays the image by emission of light by the organic light emitting element 300.

Referring to FIG. 1 and FIG. 2, the organic light emitting element 300 displays the image as described above such that the area including the organic light emitting element 300 is defined to be a display area (DA). The display area (DA) includes a first boundary 301 in the quadrangular shape with four edges and four vertices. However, a first boundary of the display area according to another exemplary embodiment may have a triangular, polygonal, or circular shape.

An organic encapsulation layer 400 is provided on the organic light emitting element 300.

The organic encapsulation layer 400 faces the substrate 100 with the organic light emitting element 300 therebetween, and it covers the organic light emitting element 300 to seal the organic light emitting element 300. The organic encapsulation layer 400 has a lesser moisture-proof effect than the inorganic encapsulation layer 500 so that the organic encapsulation layer 400 is not formed at or near the periphery of the substrate 100 but is covered and sealed by the inorganic encapsulation layer 500.

The organic encapsulation layer 400 covers the organic light emitting element 300 to cover the display area (DA) including the organic light emitting element 300, and the organic encapsulation layer 400 extends beyond the entire area of the first boundary 301 of the display area (DA) by a first distance (a) to have a second boundary 401 in a closed loop shape. That is, the second boundary 401 of the organic encapsulation layer 400 is spaced by the first distance (a) from the first boundary 301, and the second boundary 401 has a closed loop quadrangular shape. The shape of the second boundary 401 of the organic encapsulation layer 400 is formed while considering enlargement of a contact area between the substrate 100 and the inorganic encapsulation layer 500 having a greater moisture-proof effect than the organic encapsulation layer 400.

The organic encapsulation layer 400 has suitable flexibility to reinforce against brittleness of the inorganic encapsulation layer 500 having greater hardness than the organic encapsulation layer 400, and it can be a single layer or multiple layers including a resin such as polyethylene terephthalate (PET), polyimide (PI), or polycarbonate (PC).

In the organic light emitting diode (OLED) display according to the exemplary embodiment, the organic encapsulation layer 400 includes a resin including at least one of polyethylene terephthalate (PET), polyimide (PI), or polycarbonate (PC). A resin layer of the organic light emitting diode (OLED) display according to another exemplary embodiment may be a single layer or multiple layers including engineering plastic including at least one of glass fiber reinforced plastic (FRP), polyethylene terephthalate (PET), or polymethylmethacrylate (PMMA).

The inorganic encapsulation layer 500 is provided on the organic encapsulation layer 400.

The inorganic encapsulation layer 500 has a central area that faces the substrate 100 with the wire 200, the organic light emitting element 300, and the organic encapsulation layer 400 therebetween, and the inorganic encapsulation layer 500 also has an outer area or a peripheral area that contacts the substrate 100. That is, the outer area of the inorganic encapsulation layer 500 contacts the substrate 100 to cover the organic encapsulation layer 400 so the inorganic encapsulation layer 500 covers both the organic light emitting element 300 and the organic encapsulation layer 400 to seal both the organic light emitting element 300 and the organic encapsulation layer 400. The inorganic encapsulation layer 500 may be a single layer or multiple layers including an inorganic material such as silicon oxide (SiOx), silicon nitride (SiNx), titanium oxide (TiOx), or alumina ($Al_2O_3$). The inorganic encapsulation layer 500 has an end provided at a periphery of the substrate 100, and has a quadrangular shaped third boundary 501 having four edges and four vertices. That is, the third boundary 501 of the inorganic encapsulation layer 500 can be substantially equivalent to the boundary of the substrate 100. Accordingly, one edge of the third boundary 501 of the inorganic encapsulation layer 500 is spaced by a second distance (b) from the second boundary 401 of the organic encapsulation layer 400, and one vertex of the third boundary 501 is spaced by a third distance Y from the second boundary 401 of the organic encapsulation layer 400. The third distance Y between the one vertex of the third boundary 501 of the inorganic encapsulation layer 500 and the second boundary 401 of the organic encapsulation layer 400 satisfies the following equation.

$$Y = b\sqrt{2} + (a\sqrt{2} - a) \qquad \text{Equation}$$

Here, Y is a third distance, a is a first distance, and b is a second distance.

That is, the second boundary 401 of the organic encapsulation layer 400 is spaced from the first boundary 301 of the display area (DA) by the first distance (a) to have a closed loop shape, so the third distance Y between the one vertex of the third boundary 501 of the inorganic encapsulation layer 500 and the second boundary 401 of the organic encapsulation layer 400 can be set to be the maximum value. Accordingly, the contact area between the substrate 100 and the inorganic encapsulation layer 500 with a greater moisture-proof effect than the organic encapsulation layer 400 is increased to improve the moisture-proof effect for the organic light emitting element 300, thereby providing the organic light emitting diode (OLED) display with an improved encapsulation lifespan for the organic light emitting element 300.

Particularly, when the quadrangular substrate 100 is flexible with a large degree of flexibility, the vertex of the substrate 100 will deform to a larger extent due to the flexibility of the substrate 100 compared to the other parts of the substrate 100, so the part of the inorganic encapsulation layer 500 corresponding to the vertex of the substrate 100 may be more likely to be stripped or separated from the substrate 100. The organic light emitting diode (OLED) display according to the exemplary embodiment maximally or optimally sets the third distance Y between one vertex of the third boundary 501 of the inorganic encapsulation layer 500, corresponding to the vertex of the substrate 100, and the second boundary 401 of the organic encapsulation layer 400 in order to reduce or prevent the stripping of the inorganic encapsulation layer 500 caused by the flexibility of the substrate 100. The distance Y is set to increase the contact area between the substrate 100 and the inorganic encapsulation layer 500, which has a great moisture-proof effect and improves the moisture-proof effect for the organic light emitting element 300, so that an organic light emitting diode (OLED) display with an improved encapsulation life-span for the organic light emitting element 300 is provided. That is, a flexible organic light emitting diode (OLED) display with an improved encapsulation life-span for the organic light emitting element 300 is provided.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode display comprising:
   a substrate;
   a display area including an organic light emitting element on the substrate;
   an organic encapsulation layer covering the organic light emitting element and having a second boundary spaced from a first boundary of the display area by a first distance; and
   an inorganic encapsulation layer having a peripheral area contacting the substrate and covering the organic encapsulation layer, the inorganic encapsulation layer having a third boundary spaced apart from the second boundary by a second distance,
   wherein a vertex from among the four vertices of the third boundary is spaced from the second boundary by a third distance, and the third distance satisfies an equation:

$$Y = b\sqrt{2} + (a\sqrt{2} - a)$$

where Y is the third distance, a is the first distance, and b is the second distance.

2. The organic light emitting diode display of claim 1, wherein
   the first boundary of the display area has a quadrangular shape with four edges and four vertices, and
   the second boundary of the organic encapsulation layer has a closed loop shape.

3. The organic light emitting diode display of claim 2, wherein
   the third boundary of the inorganic encapsulation layer has a quadrangular shape with four edges and the four vertices.

4. The organic light emitting diode display of claim 1, wherein the substrate is flexible.

* * * * *